(12) United States Patent
Lu et al.

(10) Patent No.: US 9,754,937 B1
(45) Date of Patent: *Sep. 5, 2017

(54) HYBRID STRUCTURE WITH SEPARATE CONTROLS

(71) Applicant: Cambridge Electronics, Inc., Cambridge, MA (US)

(72) Inventors: Bin Lu, Watertown, MA (US); Ling Xia, Belmont, MA (US)

(73) Assignee: Cambridge Electronics, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/449,391

(22) Filed: Mar. 3, 2017

Related U.S. Application Data

(63) Continuation-in-part of application No. 15/376,826, filed on Dec. 13, 2016, now Pat. No. 9,614,069.

(60) Provisional application No. 62/304,032, filed on Mar. 4, 2016.

(51) Int. Cl.
| | |
|---|---|
| *H01L 27/088* | (2006.01) |
| *H01L 21/336* | (2006.01) |
| *H03K 17/687* | (2006.01) |
| *H01L 29/16* | (2006.01) |
| *H01L 29/78* | (2006.01) |
| *H01L 29/20* | (2006.01) |
| *H01L 29/778* | (2006.01) |

(52) U.S. Cl.
CPC .......... *H01L 27/0883* (2013.01); *H01L 29/16* (2013.01); *H01L 29/2003* (2013.01); *H01L 29/7787* (2013.01); *H01L 29/7819* (2013.01); *H03K 17/687* (2013.01)

(58) Field of Classification Search
CPC ............................ H01L 29/2003; H01L 29/16
USPC ................. 257/330–332, 393; 438/217, 289, 438/586–590, 604, 653
See application file for complete search history.

(56) References Cited

U.S. PATENT DOCUMENTS

| | | | |
|---|---|---|---|
| 8,017,978 B2 | 9/2011 | Lidow et al. | |
| 8,368,120 B2 | 2/2013 | Lidow et al. | |
| 9,502,535 B2 * | 11/2016 | Xia ..................... | H01L 29/4236 438/289 |

(Continued)

*Primary Examiner* — Calvin Lee
(74) *Attorney, Agent, or Firm* — American Patent Agency PC; Daniar Hussain; Xiaomeng Shi

(57) ABSTRACT

A hybrid transistor circuit is disclosed for use in III-Nitride (III-N) semiconductor devices, comprising a Silicon (Si)-based Metal-Oxide-Semiconductor Field-Effect Transistor (MOSFET), a Group III-Nitride (III-N)-based Field-Effect Transistor (FET), and a driver unit. A source terminal of the III-N-based FET is connected to a drain terminal of the Si-based MOSFET. The driver unit has at least one input terminal, and two output terminals connected to the gate terminals of the transistors respectively. The hybrid transistor circuit is turned on through the driver unit by switching on the Silicon-based MOSFET first before switching on the III-N-based FET, and is turned off through the driver unit by switching off the III-N-based FET before switching off the Silicon-based MOSFET. Also disclosed are integrated circuit packages and semiconductor structures for forming such hybrid transistor circuits. The resulting hybrid circuit provides power-efficient and robust use of III-Nitride semiconductor devices.

11 Claims, 9 Drawing Sheets

(56) References Cited

U.S. PATENT DOCUMENTS 9,536,984 B2 * 1/2017 Azize ................ H01L 29/66704
438/289
9,614,069 B1 * 4/2017 Lu ....................... H01L 29/7784
257/393

* cited by examiner

HYBRID STRUCTURE WITH SEPARATE CONTROLS

REFERENCE TO RELATED APPLICATIONS

This application is a non-provisional of and claims the benefit of priority to U.S. Ser. No. 62/304,032, filed on Mar. 4, 2016, entitled "A Hybrid Structure with Separate Controls," which is a Continuation-in-Part (CIP) of and claims the benefit of priority to U.S. Ser. No. 15/376,826, filed on Dec. 13, 2016, entitled "III-Nitride Semiconductors with Recess Regions and Methods of Manufacture," issued as U.S. Pat. No. 9,614,069 on Apr. 4, 2017, which itself is a non-provisional of and claims the benefit of priority to U.S. Ser. No. 62/298,824, filed on Feb. 23, 2016, entitled "III-Nitride Semiconductors with Recess Regions," which is also a CIP of and claims the benefit of priority to U.S. Ser. No. 15/234,405, filed on Aug. 11, 2016, entitled "Semiconductor Structure with a Spacer Layer," issued as U.S. Pat. No. 9,536,984 on Jan. 3, 2017, which itself is a non-provisional of and claims the benefit of priority to U.S. Ser. No. 62/203,438, filed on Aug. 11, 2015, entitled "Novel III-Nitride Structure with Spacer Layer," which is also a CIP of and claims the benefit of priority to U.S. Ser. No. 15/094,985, filed on Apr. 8, 2016, entitled "Semiconductor Structure and Etch Technique for Monolithic Integration of III-N Transistors," issued as U.S. Pat. No. 9,502,535 on Nov. 22, 2016, which itself is a non-provisional of and claims the benefit of priority to U.S. Ser. No. 62/146,055, filed on Apr. 10, 2015, entitled "III-Nitride Integration Technology." The entire disclosures of all cited applications are hereby incorporated by reference in their entireties herein.

FIELD OF THE INVENTION

Described herein are semiconductor device and circuits, and processes for forming such power semiconductor device and circuits. Structures and techniques as disclosed herein can be used to produce high performance transistors for various uses such as in power electronics, power amplification and digital electronics.

BACKGROUND OF THE INVENTION

The statements in this section may serve as a background to help understand the invention and its application and uses, but may not constitute prior art.

Compared with conventional power devices made of silicon (Si), Group III-Nitride (III-N) semiconductors possess many excellent electronic properties that enable the fabrication of modern power electronic devices and structures for use in a variety of applications. Silicon's limited critical electric field and relatively high resistance make currently available commercial power devices, circuits, and systems bulky, heavy, with further constraints on operating frequencies. On the other hand, higher critical electric field and higher electron density and mobility of III-N materials allow high-current, high-voltage, high-power and/or high-frequency performances of improved power transistors that are greatly desirable for advanced transportation systems, high-efficiency electricity generation and conversion systems, and energy delivery networks. Such systems rely on efficient converters to step-up or step-down electric voltages, and use power transistors capable of blocking large voltages and/or carrying large currents. For example, power transistors with blocking voltages of more than 500V are used in hybrid vehicles to convert DC power from batteries to AC power. Some other exemplary applications of power transistors include power supplies, automotive electronics, automated factory equipment, motor controls, traction motor drives, high voltage direct current (HVDC) electronics, lamp ballasts, telecommunication circuits and display drives.

Despite the enormous potential of III-N semiconductor devices for producing high-efficiency power electronics such as high power amplifiers and converters, achieving desired or projected performances is still difficult. For example, best-performing III-N transistors are generally of the depletion (normally-on) type with negative threshold voltages that require a negative gate bias to block any current flowing through. Enhancement mode (normally-off) operations often degrade device performances, and normally-off III-N transistors often have low threshold voltages and high off-state leakage currents. Cascode structures consisting of a normally-on (depletion mode) III-N transistor driven by a normally-off Si-based power MOSFET have recently been proposed and utilized to achieve normally-off behaviors, yet significant thermal and transient voltage issues still exist during high-frequency operations that limit the realizable performance of such devices.

Therefore, in view of the aforementioned practicalities and difficulties, there is an unsolved need for devices and circuits that enhance the performance of Group III-Nitride semiconductor structures.

BRIEF SUMMARY OF THE INVENTION

The present invention provides semiconductor structures and methods for fabricating III-nitride transistors with recessed regions.

In one aspect, one embodiment of the present invention is a hybrid transistor circuit comprising a Silicon-based Metal-Oxide-Semiconductor Field-Effect Transistor (MOSFET), a Group III-Nitride (III-N)-based Field-Effect Transistor (FET), and a driver unit. The Silicon-based MOSFET has a first gate terminal, a first drain terminal, and a first source terminal, where the first source terminal operates as a source terminal for the hybrid transistor circuit. The III-N-based FET has a second gate terminal, a second drain terminal, and a second source terminal connected to the first drain terminal, where the second drain terminal operates as a drain terminal for the hybrid transistor circuit. The driver unit has at least one input terminal, a first output terminal connected to the first gate terminal to apply a first switching signal, and a second output terminal connected to the second gate terminal to apply a second switching signal. The hybrid transistor circuit is turned on by switching on the Silicon-based MOSFET through the first switching signal, before switching on the III-N-based FET through the second switching signal, and the hybrid transistor circuit is turned off by switching off the III-N-based FET through the second switching signal, before switching off the Silicon-based MOSFET through the first switching signal.

In some embodiments, the III-N-based FET is normally-off with a non-negative threshold voltage. In some embodiments, the III-N-based FET has a threshold voltage between −5V and 0.5V inclusive. In some embodiments, the III-N-based FET is a GaN-based FET.

In some embodiments, the driver unit comprises a dedicated timing-control unit for generating the first and the second switching signals. In some embodiments, the driver unit comprises a driver circuit having an output terminal coupled to a first gate impedance and a second gate impedance, wherein the first gate impedance is coupled to the first gate terminal, wherein the second gate impedance is coupled to the second gate terminal, and wherein the second gate impedance is lower in resistance than the first gate impedance. In yet some other embodiments, the driver unit comprises an impedance network having at least four impedances for tuning the first and the second switching signals.

In some embodiments, a maximum voltage that can be applied to the drain terminal of the hybrid circuit is equal to or smaller than a drain-to-source breakdown voltage of the III-N-based FET, and wherein a breakdown voltage of the silicon-based MOSFET is equal to or less than a reverse gate-to-source breakdown voltage of the III-N-based FET.

In some embodiments, the silicon-based MOSFET and the III-N-based FET are fabricated on the same semiconductor chip using heterogeneous integration. In some embodiments, the driver unit is fabricated on a different semiconductor chip from the transistors.

In some embodiments, the hybrid transistor circuit further comprises one or more functional units selected from the group consisting of logic units, memories, comparators, op-amps, temperature sensors, over-current/over-voltage protection circuits, and passive components.

Yet other aspects of the present invention include the semiconductor structures, processes and methods comprising the steps described herein, and also include the processes and modes of operation of the devices described herein. Other aspects and embodiments of the present invention will become apparent from the detailed description of the invention when read in conjunction with the attached drawings.

The foregoing summary is provided by way of illustration and is not intended to be limiting.

BRIEF DESCRIPTION OF DRAWINGS

Embodiments of the present invention described herein are exemplary, and not restrictive. Embodiments will now be described, by way of examples, with references to the accompanying drawings. In these drawings, each identical or nearly identical component that is illustrated in various figures is represented by a like reference character. For purposes of clarity, not every component is labeled in every drawing. The drawings are not necessarily drawn to scale, with emphasis instead being placed on illustrating various aspects of the techniques and devices described herein.

DETAILED DESCRIPTION OF THE INVENTION

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or circuit diagrams to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, embodiments of the present invention relate to hybrid semiconductor structures, devices and integrated circuits that overcome the limitations of conventional depletion-mode Group III-Nitride (III-N) transistors and conventional cascode structures to achieve robust, reliable, and efficient high-frequency and high-voltage performances. Such hybrid structures utilize a driver unit to provide separate, specific turn-on and turn-off switching signal sequences to control the operation of a III-N-based Field-Effect Transistor (FET) connected in series to a Silicon (Si)-based Metal-Oxide-Semiconductor Field-Effect Transistor (MOSFET). The Si-based MOSFET reduces off-state leakage current of the III-N FET and eliminates false turn-on of the III-N FET where noise may trigger the device accidentally. In addition, the turn-on and turn-off switching signal sequences as provided by the present invention minimize the overlap of high-voltage and high-current conditions during fast switching, subsequently reducing turn-on transient power loss.

With references to the figures, embodiments of the present invention are now described in detail.

Figure 1:
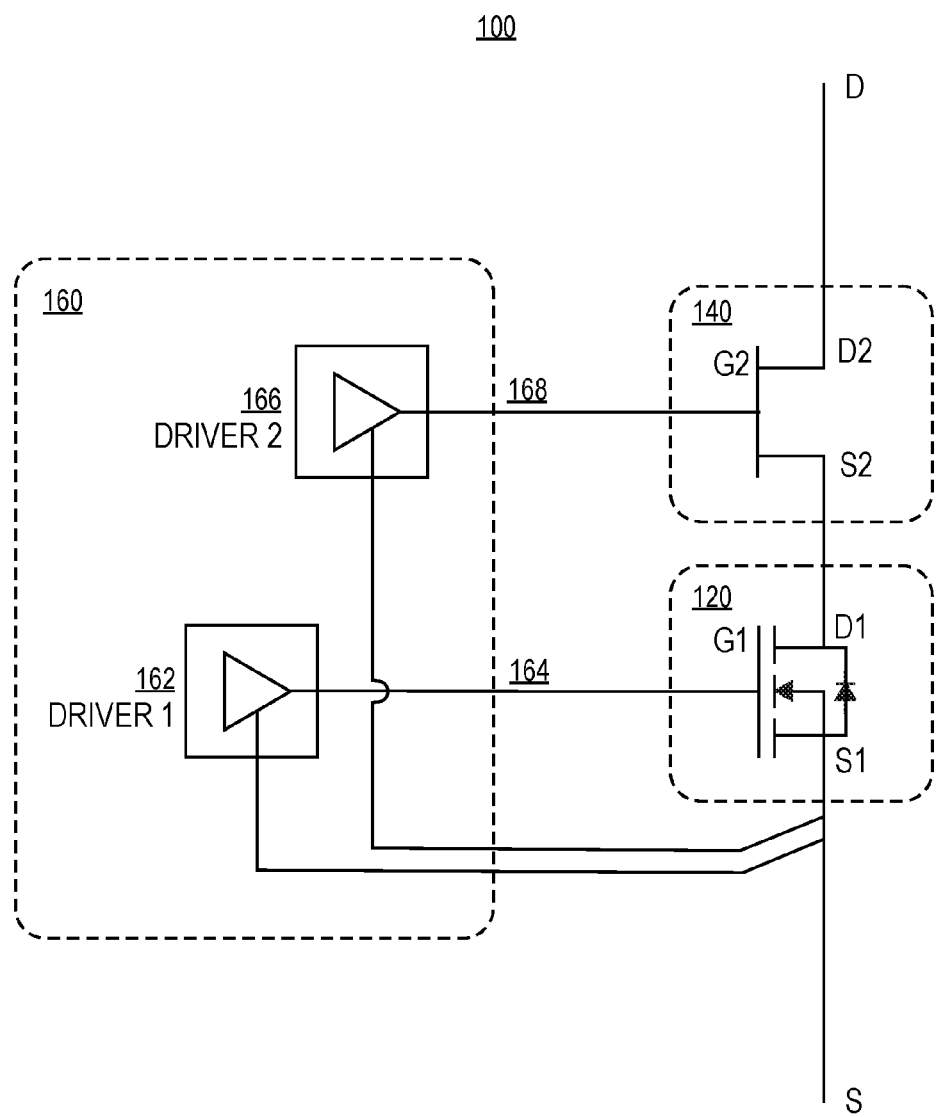
FIG. 1 shows an exemplary hybrid semiconductor structure containing a Silicon-based MOSFET, an GaN-based FET, and a driver unit, according to one embodiment of the present invention.

FIG. 1 shows an exemplary hybrid semiconductor structure 100 comprising a Si-based MOSFET with a body diode, a GaN-based FET, and a gate driver unit, according to one embodiment of the present invention. In what follows, we use GaN as an exemplary III-N material for building an III-N-based FET. In discussions disclosed herein, a GaN-based FET may be replaced by FETs based on other III-N materials, according to various embodiments of the present invention.

Conventionally, a cascode structure comprises a Si-based MOSFET with a body diode and a GaN-based FET. For example, with a normally-on GaN FET, the source terminal of the GaN-based FET may be connected to the drain terminal of the Si-based MOSFET, and the gate terminal of the GaN-based FET may be connected to the source terminal of the Si-based MOSFET. Such a conventional cascode structure allows the GaN-based FET to block high voltages to protect the Si-based MOSFET. More specifically, when the Si-based MOSFET is off, its drain voltage would roughly be on the same magnitude as the pinch-off voltage of the GaN-based FET. The gate-to source voltage of the normally-on GaN-based FET is then reverse biased, turning the GaN-based FET off. As a result, high voltages are blocked. For example, a cascode of a 650V-class normally-on GaN FET with a Si-based MOSFET having a 50V rating or less may block 650V at the drain, and operates as a normally-off device. The threshold voltage and static off-state leakage current of the cascode structure may be controlled by the Si-based MOSFET.

Several issues exist with the conventional cascode structure. First, power efficiency may be less than optimal. When a conventional cascode structure is in hard-switching transition, the normally-on GaN-based FET goes through both high current and high voltage simultaneously albeit momentarily. The overlap of high voltage and high current causes power loss during the switching transient, consequently reducing the power efficiency of systems utilizing such cascode structures. Second, reliability of the GaN-based FET may be compromised, while the choice of Si-based MOSFET may also be limited, for fast switching is desirable to minimize the transient voltage and current overlap, but switching speed is determined by the Si-based MOSFET. Third, fast switching of the conventional cascode structure may result in an avalanche breakdown of the Si-based MOSFET during turn-off transient, if the Si-based MOSFET's output capacitance is not well-matched to the GaN-based FET's output capacitance.

By comparison, hybrid structure 100 may overcome the limitations of the conventional cascode structure by utilizing novel circuit interconnections and timed gate-control signals. As shown in FIG. 1, hybrid structure, circuit, or transistor device 100 comprises a Silicon (Si)-based Metal-Oxide-Semiconductor Field-Effect Transistor (MOSFET) 120 with a body diode, a GaN-based Field-Effect Transistor (FET) 140, and a driver unit 160 with two output terminals 164 and 168. Si-based MOSFET 120 comprises a gate terminal G1, a drain terminal D1, and a source terminal S1, where the source terminal S1 also operates as a source terminal S for the hybrid transistor circuit 100. GaN-based FET 140 comprises a gate terminal G2, a drain terminal D2, and a source terminal S2, where drain terminal D2 also operates as a drain terminal D for hybrid transistor circuit 100. In addition, drain terminal D1 of Si-based MOSFET 120 is connected or coupled to source terminal S2 of GaN-based FET 140, forming a series connection between the two transistors. Gate terminals G1 and G2 of the two transistors are respectively connected to output terminals 164 and 168 of driver unit 160. During operation, a first switching signal may be applied via output terminal 164 to gate G1 of Si-based MOSFET 120, and a second switching signal may be applied via output terminal 168 to gate G2 of GaN-based FET 140. In this embodiment, driver unit 160 comprises two individual drivers, Driver1 162 and Driver2 166, each with a voltage reference connected to source terminal S1 of Si-based MOSFET 120, or source terminal S of hybrid transistor device 100. In addition, although not shown explicitly in FIG. 1, driver unit 160 may comprise at least one input control terminal for receiving one or more signal sequences to turn-on or turn-off drivers 162 and 166, in some embodiments of the present invention.

Since transistors 120 and 140 are connected in series, hybrid transistor structure, circuit, or device 100 may be viewed as in an OFF state when at least one transistor is off, and in an ON state when both transistors are on. Hence, in some embodiments of the present invention, to put hybrid structure 100 in the OFF state, Driver1 may output a zero voltage to gate G1 of Si-based MOSFET 120 to switch it off, and Driver2 may output a voltage close to the threshold voltage ($V_{TH}$) of GaN-based FET 140. Driver2 may also output a voltage lower than $V_{TH}$ to switch GaN-based FET 140 off independently from Si-based MOSFET 120. To put hybrid structure 100 in the ON state, Driver1 may output at the turn-on voltage of Si-based MOSFET 120 to switch it on; Driver2 may output above the threshold voltage $V_{TH}$ of GaN-based FET 140 to switch it on. In some embodiments, GaN-based FET 140 may be normally-on with a negative threshold voltage. In some embodiments, GaN-based FET 140 may be normally-off with a non-negative threshold voltage. In some embodiments, GaN-based FET 140 may have a threshold voltage between −5V and 0.5 inclusive.

While driver 162 and 166 may operate independently to control the operation of corresponding Si-based and GaN-based transistors, in some embodiments, switching signals on terminals 164 and 168 may be configured jointly to enable control of current flow through hybrid structure 100.

For example, in some embodiments, during the turn-on switching transition of hybrid structure 100, Driver1 may start to output a turn-on signal via terminal 164 to Si-based MOSFET 120 before Driver2 starts to output a turn-on signal via terminal 168 to GaN-based FET 140, to start switching Si-based MOSFET 120 on before start switching GaN-based FET 140 on. This turn-on signal sequence ensures that no significant current flows through hybrid structure 100 before GaN-based FET 140 is fully switched-on. Because of the fast switching characteristic of GaN-based FET 140, the resulting high voltage and high current overlap may be made sufficiently small to reduce turn-on transient power loss, compared to the conventional cascode structure.

Furthermore, during the turn-off switching transition of hybrid structure 100, Driver2 may start to output a turn-off signal via terminal 168 to GaN-based FET 140 before Driver1 starts to output a turn-off signal via terminal 164 to Si-based MOSFET 120, to start switching GaN-based FET 140 off before start switching Si-based MOSFET 120 off. Again, because of the fast switching characteristic of GaN-based FET 140, the high voltage and high current overlap may be made sufficiently small to reduce turn-off transient power loss, compared to the conventional cascode structure. The turn-off of Si-based MOSFET 120 after GaN-based FET 140 is switched-off further reduces the OFF-state leakage current of hybrid structure 100.

In some embodiments of hybrid structure 100, GaN-based FET 140 has a drain-to-source breakdown voltage equal or larger than a maximum voltage applicable to drain terminal D of hybrid structure 100. On the other hand, breakdown voltage of Si-based MOSFET 120 may be equal to or less than a reverse gate-to-source breakdown voltage of GaN-based FET 140. In addition, current ratings of both transistors may be equal to or larger than a maximum current going through the drain terminal D of hybrid structure 100.

By carefully controlling the turn-on turn-off signal sequences of transistors 120 and 140 within hybrid structure 100 through driver unit 160, embodiments of the present invention may enable the elimination of false turn-on of GaN-based FET 140, and reduce the possibility of Si breakdown. More specifically, for GaN-based transistors with low threshold voltages, noise at the gate can accidentally trigger the device. Having a Si-based MOSFET in series not only reduces the off-state leakage current but also enhances the robustness of hybrid device 100 by eliminating false turn-ons.

Figure 2:
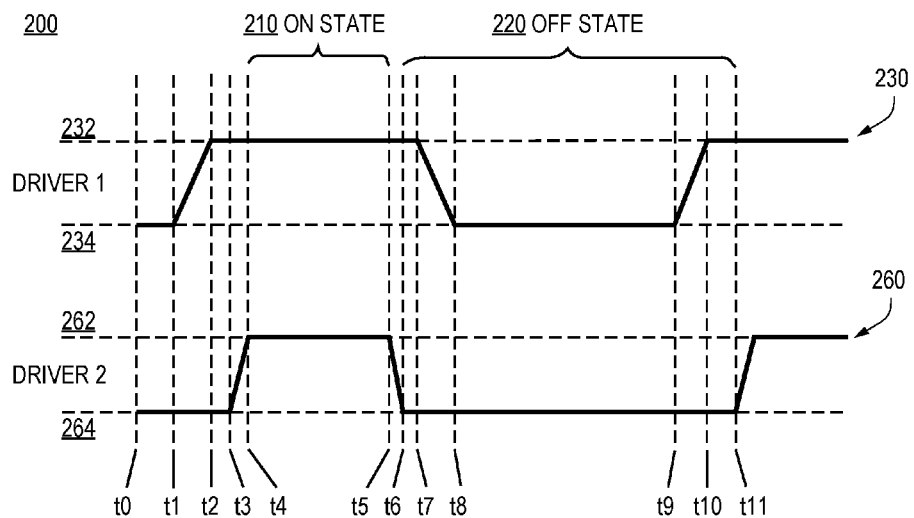
FIG. 2 shows an exemplary timing diagram for transistor switching signals, according to one embodiment of the present invention.

As a more illustrative example, FIG. 2 shows a timing diagram 200 for transistor switching signals, according to one embodiment of the present invention. In this example, one set of possible output signals 230 and 260 from Driver1 162 and Driver2 166 in FIG. 1, respectively, are drawn on a time axis, annotated by timing instances t0, t1, . . . , t11. Output signal 230 is a gate control or switching signal applied through terminal 164 to gate G1 of Si-based MOSFET 120, and oscillates between an ON voltage level 232 and an OFF voltage level 234; output signal 260 is a gate control or switching signal applied through terminal 168 to gate G2 of GaN-based FET 140, and oscillates between an ON voltage level 262 and an OFF voltage level 264. It would be understood by persons of ordinary skill in the art that the time and voltage scales as shown in FIG. 2 are arbitrary, for illustrative purposes only, and may take on any value appropriate for current implementations of Si-based MOSFETs and GaN-based or III-N-based FETs.

At time t0, both Driver1 and Driver2 may output OFF-state gate voltages. At t1, Driver1 may start to output a turn-on signal to Si-based MOSFET 120. At t2, Si-based MOSFET 120 is turned on, while GaN-based FET 140 is still in OFF state. At t3, Driver2 may start to output a turn-on signal to GaN-based FET 140. At t4, GaN-based FET 140 is turned-on and hybrid structure 100 may be view as in an ON state. In some embodiments, the difference or delay between t1 and t3, or between t2 and t3 may be adjusted to minimize the total turn-on time for hybrid structure 100, measured between t1 and t4, while maintaining low turn-on switching losses. In some embodiments, t3 may be located between t1 and t2, to start switching GaN-based FET 140 on while Si-based MOSFET 120 is also being switched on. When t4 overlaps with or falls behind t2, Silicon-based MOSFET 140 may be viewed as being fully switched on before GaN-based FET 140 is fully switched on, ensuring that no significant current may flow through hybrid structure 100 before GaN-based FET 140 is fully switched-on.

At t5, Driver2 may start to output a turn-off signal to GaN-based FET 140. At t6, GaN-based FET 140 is turned-off, while Si-based MOSFET 120 is still on. At t7, Driver1 may start to output a turn-off signal to Si-based MOSFET 120. At t8, Si-based MOSFET 120 is turned-off, further reducing the off-state leakage current of hybrid structure 100. In some embodiments, t7 may be located between t5 and t6, to start switching Si-based FET 120 off while GaN-based MOSFET 140 is also being switched off. When t8 overlaps with or falls behind t6, Silicon-based MOSFET 120 may be viewed as being fully switched off after GaN-based FET 140 is fully switched off. Between switching times t4 and t5, hybrid structure 100 may be viewed as having an ON state 210, for both constituent transistors are on. Between switching times t6 and t11, hybrid structure 100 may be viewed as having an OFF state 220, for at least one of the two constituent transistors are off.

In FIG. 2, voltages levels 232, 234, 262, and 264 are arbitrarily represented without scale or units for illustrative purposes only. In some embodiments, output signal 230 from Driver1 may range between zero and some voltage for Si-based MOSFET 120. On the other hand, GaN-based FET 140 shown in FIG. 1 may be either normally-on or normally-off, with either negative or non-negative threshold voltages and/or turn-on voltages. In some embodiments, GaN-based FET 140 may be normally-on, with a negative threshold voltage, and turn-off signal level 264 from Driver2 may also be negative. In some embodiments, GaN-based FET 140 may be normally-off, with a threshold voltage close to zero or in the positive voltage range. Correspondingly, output signal 260 for turning on GaN-based FET 140 may range between zero and positive voltages.

Figure 3:
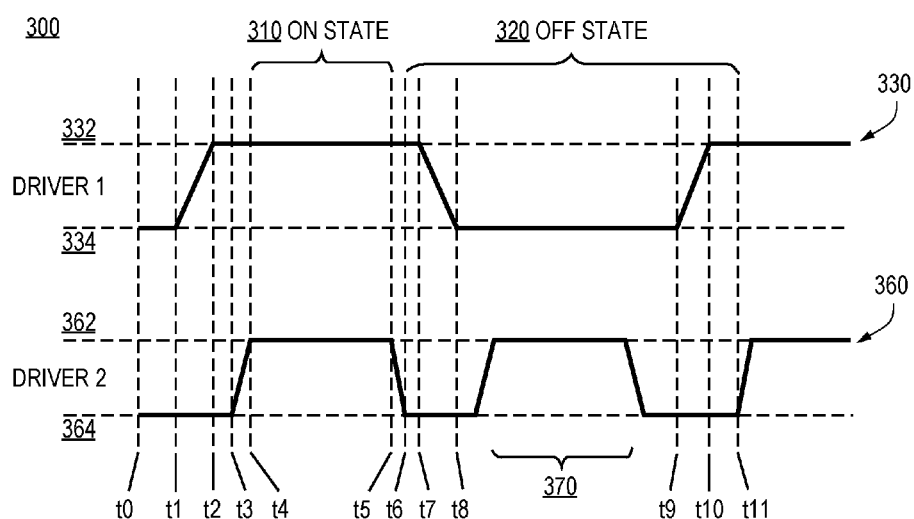
FIG. 3 shows another exemplary timing diagram for transistor switching signals, according to another embodiment of the present invention.

As another illustrative example, FIG. 3 shows a timing diagram 300 for transistor switching signals, according to another embodiment of the present invention. Like signals 230 and 260 shown in FIG. 2, in this figure, another set of possible output signals 330 and 360 from Driver1 162 and Driver2 166 in FIG. 1, respectively, are drawn on a time axis, annotated by timing instances t0, t1, . . . t11. The hybrid device enters ON state 310 when both transistors have been turned on, and OFF state 320 as soon as one of the transistors is being turned off. While signal 330 is identical to signal 230, signal 360 differs from signal 260 within time period 370, during which reverse conduction may be achieved by having Driver2 sending a turn-on pulse to GaN-based FET 140. Reverse conduction is the state of having current flowing from source terminal S to drain terminal D of hybrid transistor device 100. The reverse conduction state helps reduce conduction losses through the hybrid transistor device.

To achieve timed gate control of the hybrid transistor device using gate signals such as shown in FIG. 2 and FIG. 3, several implementations may be realized according to various embodiments of the present invention.

Figure 4:
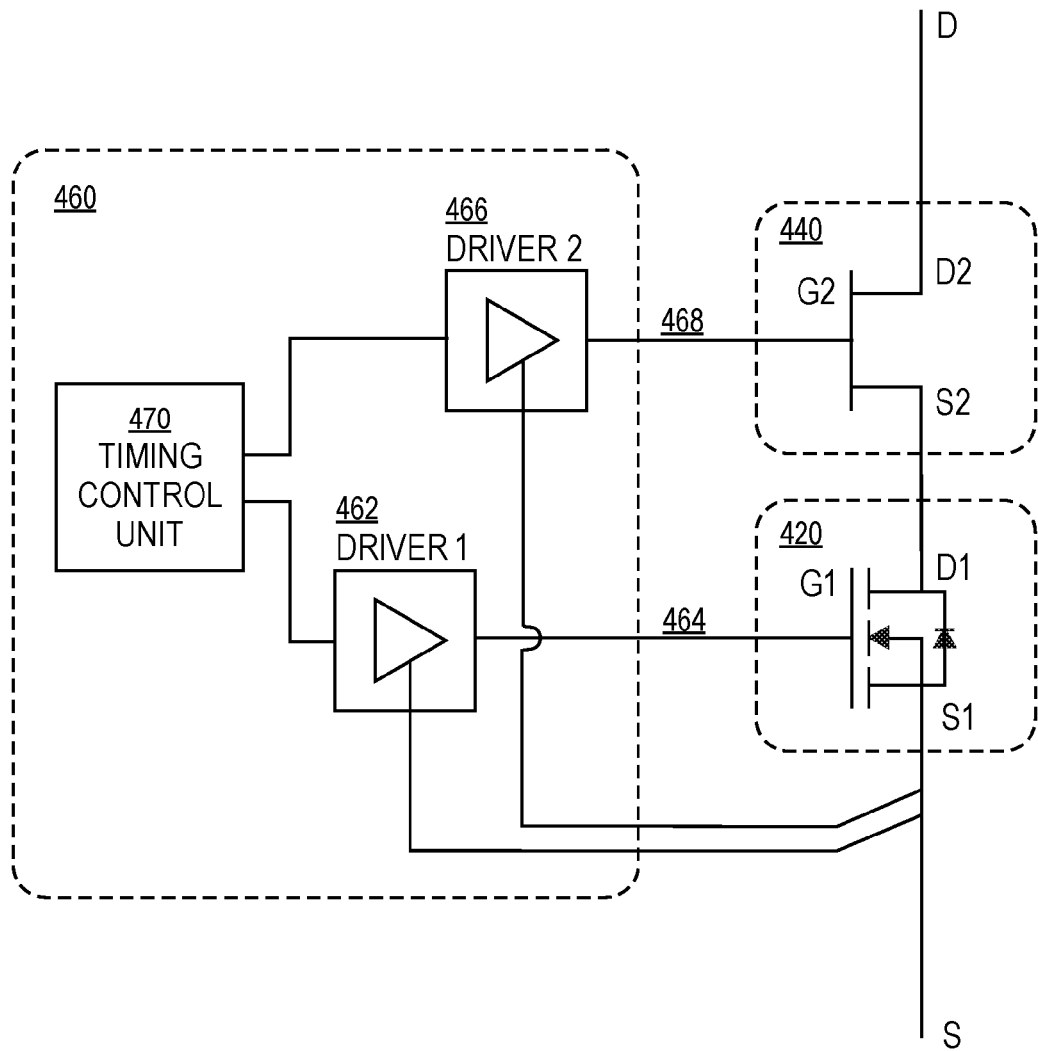
FIG. 4 shows an exemplary hybrid semiconductor structure containing a silicon-based MOSFET, a GaN-based FET, and a driver unit comprising a timing control unit, according to one embodiment of the present invention.

In a first example, FIG. 4 shows a hybrid semiconductor transistor circuit 400 comprising a Si-based MOSFET 420, a GaN-based FET 440, and a driver unit 460 comprising two drivers 462 and 466 plus a timing control unit 470, according to one embodiment of the present invention. Timing control unit 470 may coordinate driver output signals on terminals 464 and 468 connected to gate terminals G1 and G2 respectively. In different embodiments, timing control unit 470 may be any digital, analog, or combination of digital and analog circuits. In some embodiments, timing control unit 470 may further comprise an input switch signal for turning the overall hybrid circuit on or off.

Figure 5:
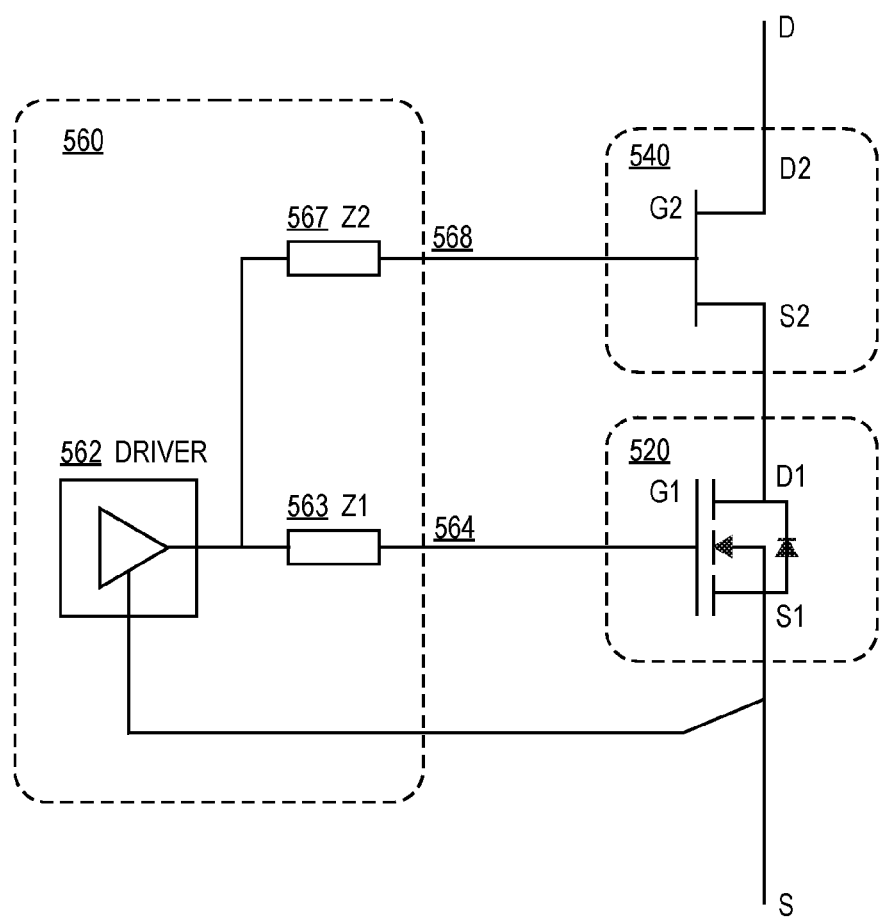
FIG. 5 shows an exemplary hybrid semiconductor structure containing a silicon-based MOSFET, a GaN-based FET, and a driver unit with tuned impedances, according to one embodiment of the present invention.

Alternatively, FIG. 5 shows another hybrid semiconductor structure 500 comprising a Si-based MOSFET 520, a GaN-based FET 540, and a driver unit 560, according to another embodiment of the present invention. In this embodiment, driver unit 560 comprises a single driver 562, with driver output tuned through gate impedances Z1 563 and Z2 567 respectively, to generate two separate gate control signals. Impedance Z1 563 is coupled to gate G1 of Si-based MOSFET 520; Impedance Z2 567 is coupled to gate G2 of GaN-based FET 540. The impedance values of Z1 and Z2 may be adjusted to achieve any desired delays in the signal output sequences sent via terminals 564 and 568. For example, Z1 may be of higher resistance than Z2, to allow faster discharge of GaN-based FET 540 than Si-based MOSFET 520 when driver 562 outputs a zero voltage. Consequently, GaN-base FET 540 may turn off before Si-based MOSFET 520 turns off. Similarly, when driver 562 outputs a turn-on signal, GaN-based FET 540 may turn on only after Si-based MOSFET turns on. In some embodiments, output signal from driver 562 may be tuned by an impedance network with any number of impedances and two output leads coupled to gates G1 and G2.

Figure 6:
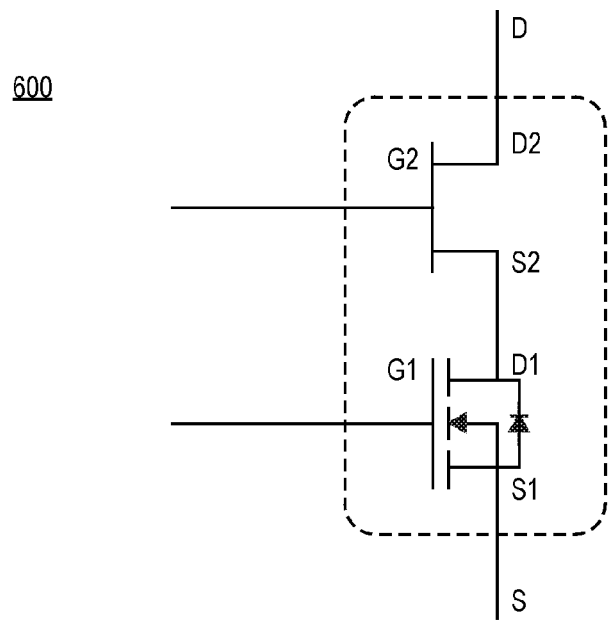
FIGS. 6 and 7 show exemplary integrated circuit packages for hybrid semiconductor structures, according to two embodiments of the present invention, respectively.
Figure 7:
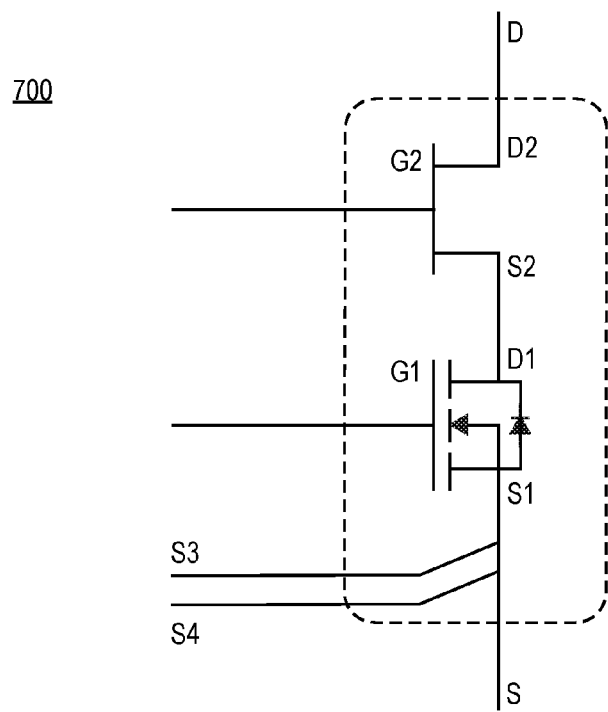

While FIGS. 4 and 5 provide exemplary circuits for implementing the hybrid semiconductor transistor circuit as disclosed, FIGS. 6 and 7 show exemplary integrated circuit packages 600 and 700 respectively, each for a hybrid semiconductor structure containing a silicon-based MOSFET and a GaN-based FET, according to one embodiment of the present invention.

In FIG. 6, the two transistors are connected in series internally. The transistors may be fabricated on two different semiconductor chips, or on the same chip using heterogeneous integration. For example, a GaN-based FET may be bonded to a Si-based MOSFET chip, or on the same Si-based MOSFET in a III-nitride epitaxial region. In this example, terminals of package 600 include a drain terminal D, a source terminal S, and two input transistor gate terminals. Package 600 may be of any suitable type, including but not limited to, transistor outline (TO) package and Power Quad Flat No-Leads (PQFN) package.

FIG. 7 shows another integrated circuit package 700 with two additional terminals S3 and S4 for Kelvin sensing of the source. In some embodiments, terminals S3 and S4 are combined into a single lead.

Figure 8:
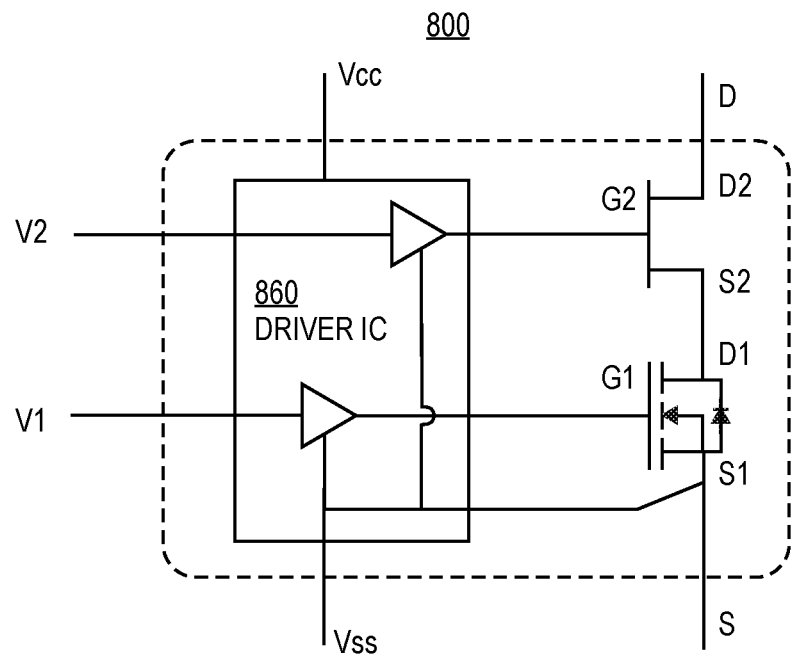
FIGS. 8, 9, and 10 show exemplary integrated circuit packages for hybrid semiconductor structures comprising a driver unit, according to some embodiments of the present invention, respectively.
Figure 9:
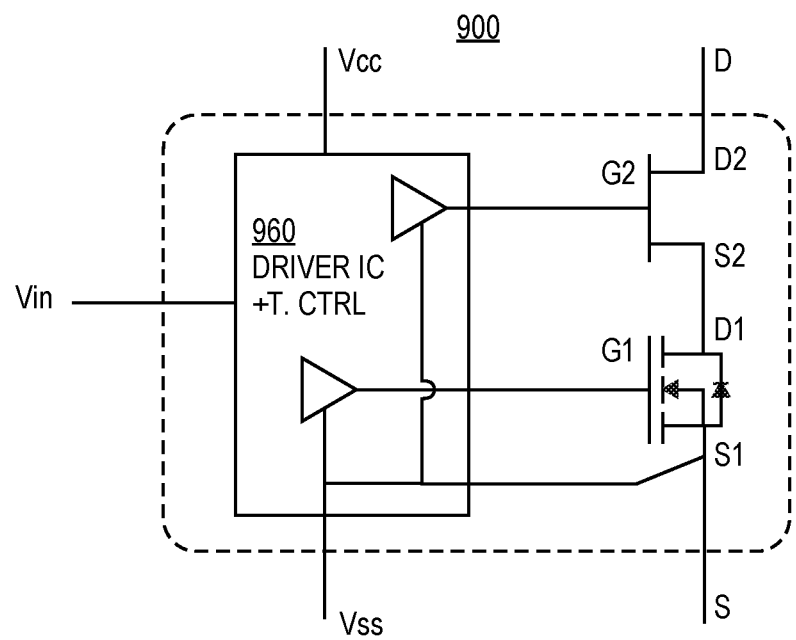
Figure 10:
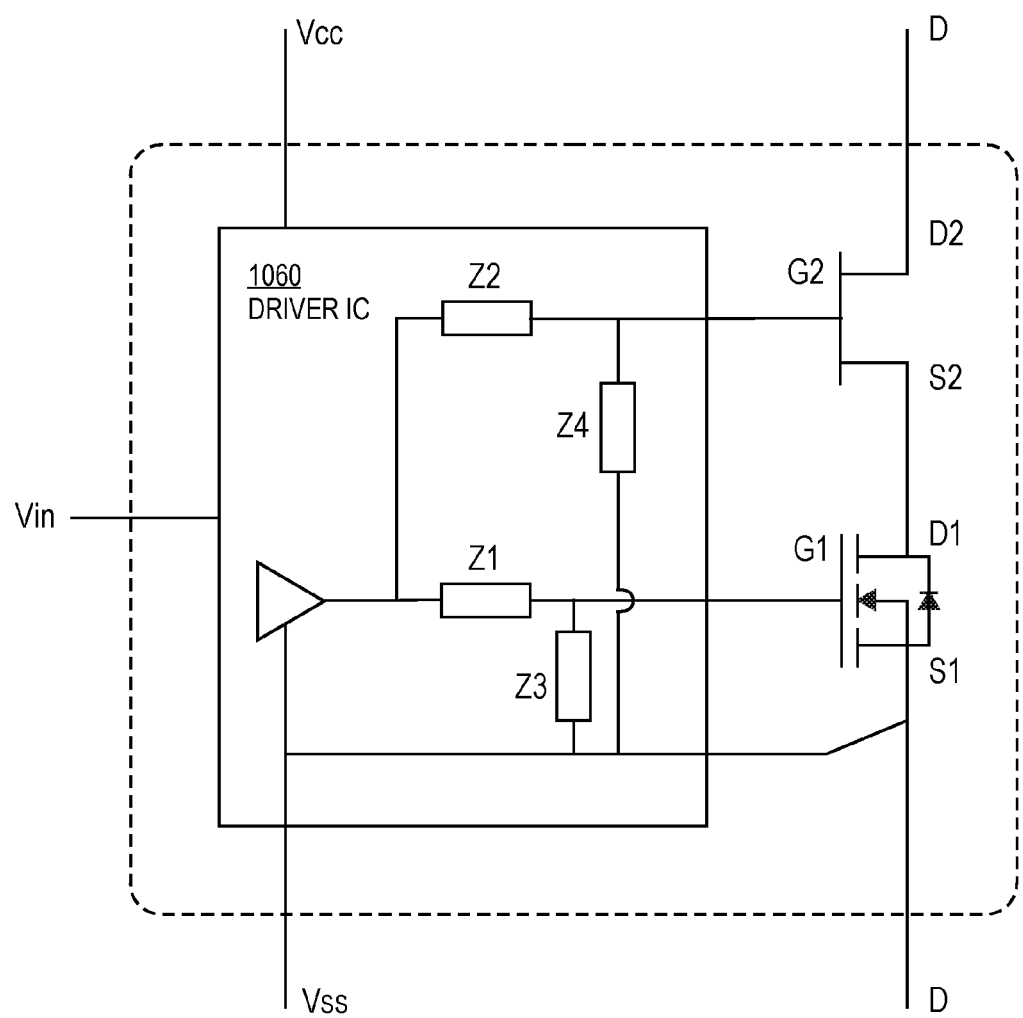

FIGS. 8, 9, and 10 show other exemplary integrated circuit packages 800, 900, and 1000 respectively for a hybrid semiconductor structure, each containing a silicon-based MOSFET, a GaN-based FET, and a driver unit, according to one embodiment of the present invention.

In FIG. 8, integrated circuit package 800 includes a Si-based MOSFET, a GaN-based FET, and a driver integrated circuit (IC) 860. Internally, source terminal S2 of the GaN-based FET is connected to drain terminal D1 of the Si-based MOSFET. Two outputs of driver IC 860 are interconnected to gates G1 and G2 of the transistors respectively. Again, the two transistors may be fabricated on two different semiconductor chips or on the same chip by a heterogeneous integration process. Moreover, driver IC 860 may be fabricated on the same chip as the Si-based MOSFET, or on different chips. Also, in this embodiment, integrated circuit package 800 may comprise at least a drain terminal D, a source terminal S, an IC power supply lead Vcc for powering the driver IC, a voltage reference Vss connected to the source terminal, and two input leads V1 and V2 for signaling driver IC 860.

Similarly, integrated circuit packet 900 shown in FIG. 9 comprises a Si-based MOSFET, a GaN-base FET, and a driver IC 960. In this embodiment, driver IC 960 may further comprise a timing control unit to control the turn-on turn-off signal timing for the transistors, and only one on-off control signal input Vin may be necessary.

FIG. 10 is an exemplary integrated circuit package 1000 comprising tuned impedances, similar to hybrid circuit 500 shown in FIG. 5, according to one embodiment of the present invention. In this embodiment, driver IC 1060 comprises a single driver, and gate control output timing is realized by impedance network comprising impedances Z1, Z2, Z3, and Z4.

Embodiments of the present invention are not limited to integrated circuit packages shown in FIGS. 6, 7, 8, 9 and 10 only. Other functional units may also be included in the same package as with the Si-based MOSFET and/or the GaN-based FET. Exemplary functional units include, but are not limited to, logic unit, memories, comparators, op-amps, temperature sensors, over-current/over-voltage protection circuits and other passive components. Furthermore, multiple units of integrated circuit packages 600 or 700 shown in FIGS. 6 and 7 may be included in a single package to form a half-bridge, a full-bridge or other types of circuits.

So far, discussions within the present disclosure have focused on hybrid semiconductor structures and integrated circuits with new and novel features to enable efficient transistor operations with low off-state leakage current, few false turn-ons, and low turn-on transient power losses. In some embodiments, Si-based MOSFETs and III-N-based FETs including GaN-based FETs as disclosed may be formed using multi-layer semiconductor structures and techniques that exploit selective etching between different semiconductor material layers, according to embodiments discussed in related applications U.S. Pat. No. 9,502,535, U.S. Pat. No. 9,536,984, and U.S. patent application Ser. No. 15/376,826.

Figure 11:
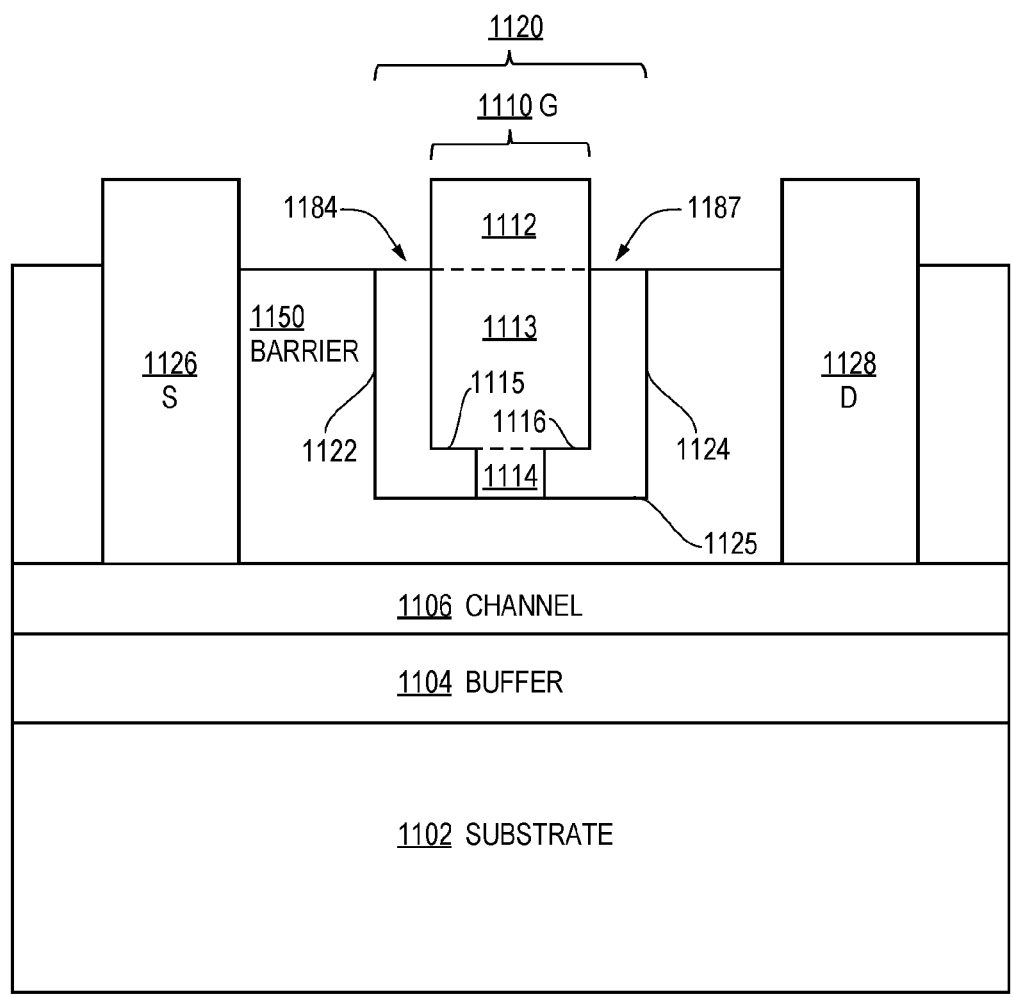
FIG. 11 shows an exemplary III-N-based FET, according to one embodiment of the present invention.

As an illustrative example, FIG. 11 shows a III-N-based FET that may be used in a hybrid transistor circuit as disclosed herein, according to one embodiment of the present invention. More specifically, FIG. 11 shows a cross-section view of an exemplary semiconductor structure 1100 containing a recessed-gate transistor with a gate contact 1110 stepped on the bottom and insulated from sidewalls 1122 and 1124 of a gate recess 1120 by filler elements 1184 and 1187. Semiconductor structure 1100 may include a substrate 1102, a buffer layer 1104, a channel layer 1106, and a barrier layer 1150, comprising suitable semiconductor materials including III-N materials as disclosed in related applications referenced above. By forming gate and/or ohmic recesses with specific, controllable depths, desired threshold voltages may be achieved, enabling the production of normally-on and/or normally-off III-N-based FETs, and the integration of enhancement-mode and depletion-mode transistors on a common substrate. By modifying gate edge profile within the gate recess at the bottom and further shielding or insulating the recessed and stepped gate electrode from enclosing semiconductor materials, embodiments of the present invention may also help significantly reduce gate leakage current through the III-N-based FET.

In semiconductor structure 1100 shown in FIG. 11, gate recess 1120 is etched into barrier layer 1150, where a bottom 1125 of gate recess 1120 is within barrier layer 150. Gate contact 1110 is disposed within gate recess 1120, in-between source and drain ohmic contacts 1126 and 1128 recessed into barrier layer 1150. A lower portion of gate contact 1110 is stepped to form a bottom stem 1114 and two bottom steps 1115 and 1116 within gate recess 1120. In other words, gate edge profiles of gate contact 1110 is modified in FIG. 11 through the stepping process to increase an overall surface area around the bottom of the gate electrode. In some embodiments, multiple steps may be formed at the bottom of gate contact 1120, on one side or on both sides, using multiple filler elements formed using one or more selective etching steps. Furthermore, in some embodiments, gate contact 1110 may be stepped to form a bottom stem and a single bottom step 1116, on the side towards the drain ohmic contact, to reduce gate-drain leakage current. In FIG. 11, each of bottom step 1115 and 1116 is represented as a lower surface of the stepped portion of gate contact 1110. Alternatively, a bottom step may be viewed as a cornered volume of the stepped portion of gate contact 1110.

In addition, in this example, a non-stepped middle portion 1113 of gate contact 1110, located above bottom steps 1115 and 1116, is shown to have the same lateral length as top portion 1112 of gate contact 1110, where top portion 1112 exceeds a top level of gate recess 1120. In some embodiments, top portion 1112 may be no greater in length than non-stepped middle portion 1113. In some embodiments, top portion 1112 may be no greater in length than gate recess 1120. In yet some embodiments, top portion 1112 may be wider in length than non-stepped middle portion 1113, or gate recess 1120, to form a T-shaped or F-shaped gate top, which may also be viewed as a gate electrode with one or more field plate extensions.

Furthermore, in this example, filler element 1184 is of a L-shape, while filler element 1187 is of a laterally-inverted L-shape. Filler element 1184 covers bottom step 1115 and the sidewall of gate contact 1110 on the side of the source ohmic contact. Filler element 1184 also covers or is in contact with sidewall 1122 of gate recess 1120 on the side of the source ohmic contact. Similarly, filler element 1187 covers bottom step 1116 and the sidewall of gate contact 1110 on the side of the drain ohmic contact. Filler element 1187 is further in contact with sidewall 1124 of gate recess 1120 on the side of the drain ohmic contact. Each filter element may comprise one or more insulating materials, possibly layered or stacked either laterally or vertically. In some embodiments, filler elements 1184 and 1187 may raise above the top level of gate recess 1120, and may further be extended laterally to fully or partially cover a top surface of barrier layer 1150, or any other semiconductor layers placed thereon.

Figure 12:
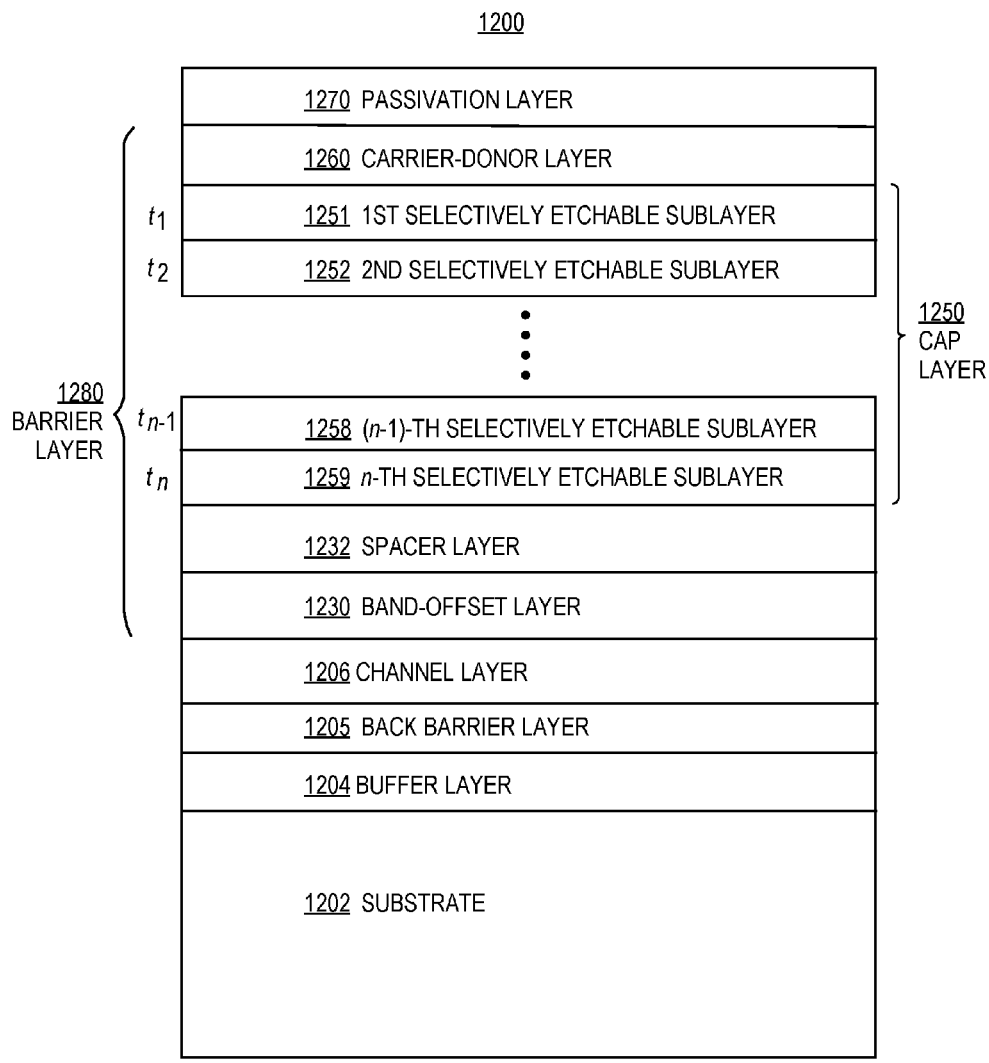
FIG. 12 shows a multi-layer semiconductor structure for forming an III-N-based FET, according to one embodiment of the present invention.

FIG. 12 shows an illustrative multi-layer semiconductor structure 1200, according to one embodiment of the present invention. Multi-layer semiconductor structure 1200 may be used for fabricating III-N transistors having different threshold voltages ($V_T$) and bottom-stepped gate contacts, as disclosed herein. The threshold voltage of a transistor is a gate voltage past which the transistor is turned from an ON state to an OFF state, or vice versa. Semiconductor structure 1200 may include a substrate layer 1202, a buffer layer 1204, a back barrier layer 1205, a channel layer 1206, and a barrier layer 1280. In some embodiments, barrier layer 1280 may further comprise a band-offset layer 1230, a spacer layer 1232, a cap layer 1250, a carrier donor layer 1260, and a passivation layer 1270. Each of substrate layer 1202, buffer layer 204, and channel layer 1206 may be formed using materials and processes as disclosed in related applications referenced above. Back barrier layer 1205 and each or any barrier sublayer as disclosed herein may be optional.

In some embodiments, cap layer 1250 comprises a plurality of n selectively etchable sublayers, such as sublayer 1251 with thickness $t_1$, sublayer 1252 with thickness $t_2$, sublayer 1258 with thickness $t_{n-1}$, and sublayer 1259 with thickness $t_n$, where n may be any even or odd integer greater than or equal to two. For example, a multi-layer barrier 1280 with a cap layer 1250 may have n=4 sublayers, a band-offset layer, and a carrier-donor layer. Thickness $t_1, t_2, \ldots, t_n$ may be between 2 angstroms and 500 nanometers, and may or may not be the same in various embodiments of the present invention. For example, $t_n$ may be greater than or equal to the total thickness of all other sublayers. In another example, all odd-numbered or odd sublayers may be grown to a first thickness, while all even-numbered or even sublayers may be grown to a second thickness.

In some embodiments, each i-th sublayer ($1 \le i \le n$) of cap layer 1250 is selectively etchable with respect to the (i+1)-th sublayer below using some etching technique, thus the (i+1)-th sublayer below may serve as an etch stop for the i-th sublayer under the given etching technique. The n-th sublayer may further be selectively etchable with respect to band-offset layer 1230, spacer layer 1232, or any layer disposed directly below and/or in contact with the n-th sublayer. Spacer layer 1232 may or may not be selectively etchable over band-offset layer 1230. In some embodiments, each sublayer is selectively etchable with respect to both the sublayer above and the sublayer below using some etching technique, such as dry etching, wet etching, or a combination of dry etching and wet etching. For example, selectively etchable sublayers may be classified into two types. All odd sublayers counting from the first sublayer 1251 may be formed of a material that is selectively etchable with respect to even sublayers by a first etching technique, such as dry etching, while all even sublayers counting from the second sublayer 1252 may be formed of a material that is selectively etchable with respect to odd sublayers by a second etching technique, such as wet etching, or vice versa. The n-th sublayer may further be selectively etchable with respect to band-offset layer 1230, spacer layer 1232, or any layer disposed directly below and/or in contact with the n-th sublayer, using a dry etch process, a wet etch process or a combination thereof. The n-th sublayer may be etched at a faster rate the layer below, and the selectivity of the etch process may be greater than 3:1, such that the n-th sublayer is etched at a rate greater than three times as high as the rate at which layer below is etched. Spacer layer 1232 may or may not be selectively etchable over sublayer 1259 and/or band-offset layer 1230. Band-offset layer 1230 may or may not be selectively etchable over sublayer 1259 and/or spacer layer 1232. Each of the odd sublayers may have the same structure, composition, and/or thickness. Alternatively, each of the odd sublayers may have a different structure, composition, and/or thickness. Similarly, each of the even sublayers may have the same structure, composition, and/or thickness, or a different structure, composition, and/or thickness. In yet some other embodiments, each sublayer may be selectively etchable with respect to a selected subset of all other sublayers, using one or more etching techniques. For example, in some embodiments, selectively etchable sublayers may be classified into three types, where each type is repeated every three sublayers, and where each type is selectively etchable over the other two types using one or more etching techniques.

More specifically, selective etchability of sublayers within cap layer 1250 may be achieved by alternating sublayer material between two or more types of compositions. In some embodiments, all odd sublayers counting from the first sublayer 1251 may include or comprise a semiconductor material that is selectively etchable in a dry etching process, such as GaN, or another nitride semiconductor material $B_wAl_xIn_yGa_zN$, in which w, x, y and z each has a suitable value between zero and one inclusive ($0 \le w, x, y, z \le 1$), and the composition is such that the nitride semiconductor material is selectively etchable using a dry etching process. In one example, odd sublayers may be formed of a semiconductor material $B_wAl_xIn_yGa_zN$ where x is less than 0.25. In different embodiments, the values of w, x, y, and z may or may not add to 1. In some embodiments, odd sublayers may be formed of a semiconductor material $Al_xIn_yGa_zN$ in which x, y, and z each has a suitable value between zero and one inclusive ($0 \le x, y, z \le 1$), and where the values of x, y, and z may or may not add to 1. Similarly, all even sublayers counting from the second sublayer 1252 may include or comprise a semiconductor material that is selectively etchable in a wet etching process, such as AlN, or another nitride semiconductor material $B_wAl_xIn_yGa_zN$, in which w, x, y and z each has a suitable value between zero and one inclusive ($0 \le w, x, y, z \le 1$), and the composition is such that the nitride semiconductor material is selectively etchable using a wet etching process. The values of w, x, y, and z may or may not add to 1. In one example, even sublayers may be formed of a semiconductor material $B_wAl_xIn_yGa_zN$ where x is greater than 0.5. In some embodiments, even sublayers may be formed of a semiconductor material $Al_xIn_yGa_zN$ in which x, y, and z each has a suitable value between zero and one inclusive ($0 \le x, y, z \le 1$), and where the values of x, y, and z may or may not add to 1. In those embodiments, at least one of the selectively etchable sublayers may have a non-zero Ga content (0<z≤1) that makes the layer growth process easier. When consecutive, adjacent or continuous sublayers of cap layer 1250 have their material compositions alternate between GaN and AlN, fluorine-based chemicals may be used to dry etch GaN without etching AlN, while tetramethylammonium hydroxide (TMAH) may be used to wet etch AlN without etching GaN. In some embodiments, odd layers may include or comprise a semiconductor material that is selectively etchable in a wet etching process, such as AlN, while even layers may include or comprise a semiconductor material that is selectively etchable in a dry etching process, such as GaN.

The reference herein to $B_wAl_xIn_yGa_zN$, "$B_wAl_xIn_yGa_zN$ material," or "III-N material" refers to a semiconductor material having nitride and one or more of boron, aluminum, indium and gallium. An $Al_xIn_yGa_zN$ material is a $B_wAl_xIn_yGa_zN$ material where w=0. Examples of $B_wAl_xIn_yGa_zN$ materials include, but are not limited to, GaN, AlN, AlGaN, AlInGaN, InGaN, and BAlInGaN, $Al_{0.15}Ga_{0.85}N$, and $Al_{0.65}Ga_{0.35}N$, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant such as silicon or germanium.

In some embodiments, selective etchability of sublayers within cap layer 1250 is achieved by alternating aluminum content or composition of adjacent or consecutive sublayers between a relatively high value or percentage and a relatively low value or percentage. In other words, selective etchability may be achieved by alternating between Al-light and Al-rich sublayers, or adjusting the value of x for material $B_wAl_xIn_yGa_zN$ or $Al_xIn_yGa_zN$ as described above. In one example, consecutive or adjacent sublayers of cap layer 1250 may have Al contents alternating between less than 0.5 inclusive and greater than 0.5 exclusive, less than 0.5 exclusive and greater than 0.5 inclusive, or less than 0.5 exclusive and greater than 0.5 exclusive. In other examples, consecutive or adjacent sublayers of cap layer 1250 may have Al content alternate between less than 0.25 and greater than 0.5, less than 0.35 and greater than 0.5, or less than 0.35 and greater than 0.65, inclusive or exclusive. In some embodiments, at least one of the plurality of selectively etchable sublayers has an Al content great than 0.5. In addition, at least one of the selectively etchable sublayers may have a non-zero Ga content (0<z≤1). Moreover, B, Al, In, and Ga compositions in each type of sublayers may not necessarily be the same. For example, when n is odd, first sublayer 1251 and n-th sublayer 1259 may have x=0.1 and x=0.2 respectively, while second layer 1252 and (n−1)-th sublayer 1258 may have x=0.6 and x=0.7 respectively. Similarly, when n is even, first sublayer 1251 and (n−1)-th sublayer 1258 may have x=0.1 and x=0.2 respectively, while second sublayer 1252 and n-th sublayer 1259 may have x=0.6 and x=0.7 respectively.

In some embodiments, each layer or sublayer of multi-layer semiconductor structure 1200 may comprise a III-N material $B_wAl_xIn_yGa_zN$, and optional spacer layer 1232 may comprise a III-N material with a zero Al content in the form of $B_wIn_yGa_zN$, including materials such as GaN and InGaN. Spacer layer 1232, or any other sublayer of barrier 1280 may also be n-type doped.

In some embodiments, one or more layers or sublayers shown in FIG. 12 may comprise III-N materials such as GaN, AlN, AlGaN, InAlN, and AlInGaN. For example, channel layer 1206 may comprise GaN, band-offset layer 1230 may comprise AlGaN, spacer layer 1232 may comprise GaN, and cap layer 1250 may comprise alternating layers of GaN and AlN. In some embodiments, band-offset layer 1230 may comprise a III-N material with a non-zero Al content. In some embodiments, band-offset layer 1230 may comprise a III-N material $Al_xIn_yGa_zN$ in which x+y+z=1, 0<x≤1, 0≤y≤1, and 0≤z≤1. In yet some embodiments, band-offset layer 1230 may comprise a III-N material $Al_xGa_zN$ in which x+z=1, 0.05<x≤0.4, and 0.6≤z<0.95.

In some embodiments, band-offset layer 1230 may have a wider bandgap or a higher conduction band edge than channel layer 1206 below and spacer layer 1232 above. In addition, spacer layer 1232 may have a narrower bandgap or a lower conduction band edge than sublayer 1259 immediately above. A spacer layer with a narrower bandgap makes the net polarization charge at the interface between the spacer layer and the band-offset layer negative as the polarization of the spacer layer is smaller than that of the band-offset layer, thus helping to improve the threshold voltages when the multi-layer structure 1200 with spacer layer 1232 is used in a field-effect transistor.

In yet some embodiments, barrier layer 1280 may comprise a bottom sublayer, a middle sublayer, and a top sublayer, where the bottom sublayer may have an equal or wider bandgap than channel layer 1206 below, the middle sublayer may have an equal or wider bandgap than the bottom sublayer, while the top sublayer may have an equal or narrower bandgap than the middle sublayer. For example, such bottom, middle and top sublayers may correspond to band-offset layer 1230, spacer layer 1232, and sublayer 1259 in FIG. 12, respectively. In some embodiments, the bottom sublayer comprises $Al_{x1}Ga_{z1}N$, the middle sublayer comprises AlN, and the top sublayer comprises $Al_{x2}Ga_{z2}N$. The middle sublayer may serve as an etch stop for the top sublayer.

Furthermore, optional spacer layer 1232 shown in FIG. 12 may have a thickness less than or equal to 20 nm, and/or greater than or equal to 0.2 nm. In various embodiments, thickness of a layer or sublayer may refer to an average, maximum, or medium vertical distance measured between points on an upper interface and a lower interface of the layer or sublayer.

Additionally, a back barrier layer 1205 may be inserted between channel layer 1206 and buffer layer 1230 in some embodiments, where the added back barrier layer may comprise a III-N material $Al_xIn_yGa_zN$ in which 0≤x≤1, 0≤y≤1, and 0≤z≤1, such as InN, AlN, InGaN, AlGaN, InAlN, and InAlGaN. The thickness of back barrier layer 1205 may be between 1nm and 5 μm, but less than a critical thickness before which back barrier layer 1205 may crack due to mechanical stress. Back barrier layer 1205 may have a wider bandgap than channel layer 1206, a stronger polarization in the c-axis, or a negative polarization in the c-axis than that of the channel layer, so electrons in the channel layer may be better confined.

ADDITIONAL ASPECTS

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having,"

"containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present. The partially open-ended phrase "consisting essentially of" is meant to encompass essentially the material listed and does not preclude the presence of relatively small quantities of other materials, including the presence of dopants.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments. In other words, although the present invention has been described with reference to specific exemplary embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. A hybrid transistor circuit, comprising:
    a Silicon-based Metal-Oxide-Semiconductor Field-Effect Transistor (MOSFET) having a first gate terminal, a first drain terminal, and a first source terminal, wherein the first source terminal operates as a source terminal for the hybrid transistor circuit;
    a Group III-Nitride (III-N)-based Field-Effect Transistor (FET) having a second gate terminal, a second drain terminal, and a second source terminal connected to the first drain terminal, wherein the second drain terminal operates as a drain terminal for the hybrid transistor circuit; and
    a driver unit having at least one input terminal, a first output terminal connected to the first gate terminal to apply a first switching signal, and a second output terminal connected to the second gate terminal to apply a second switching signal, wherein
    the hybrid transistor circuit is turned on by switching on the Silicon-based MOSFET through the first switching signal, before switching on the III-N-based FET through the second switching signal, and
    the hybrid transistor circuit is turned off by switching off the III-N-based FET through the second switching signal, before switching off the Silicon-based MOSFET through the first switching signal.

2. The hybrid transistor circuit of claim 1, wherein the III-N-based FET is a GaN-based FET.

3. The hybrid transistor circuit of claim 1, wherein the III-N-based FET is normally-off with a non-negative threshold voltage.

4. The hybrid transistor circuit of claim 1, wherein the III-N-based FET has a threshold voltage between −5V and 0.5V inclusive.

5. The hybrid transistor circuit of claim 1, wherein the driver unit is fabricated on a different semiconductor chip from the transistors.

6. The hybrid transistor circuit of claim 1, wherein the driver unit comprises a dedicated timing-control unit for generating the first and the second switching signals.

7. The hybrid transistor circuit of claim 1, wherein the Silicon-based MOSFET and the III—N-based FET are fabricated on the same semiconductor chip using heterogeneous integration.

8. The hybrid transistor circuit of claim 1, wherein the driver unit comprises an impedance network having at least four impedances for tuning the first and the second switching signals.

9. The hybrid transistor circuit of claim 1, further comprising one or more functional units selected from the group consisting of logic units, memories, comparators, op-amps, temperature sensors, over-current/over-voltage protection circuits, and passive components.

10. The hybrid transistor circuit of claim 1, wherein a maximum voltage that can be applied to the drain terminal of the hybrid circuit is equal to or smaller than a drain-to-source breakdown voltage of the III-N-based FET, and wherein a breakdown voltage of the Silicon-based MOSFET is equal to or less than a reverse gate-to-source breakdown voltage of the III-N-based FET.

11. The hybrid transistor circuit of claim 1, wherein the driver unit comprises:
    a driver circuit having an output terminal coupled to a first gate impedance and a second gate impedance,
        wherein the first gate impedance is coupled to the first gate terminal,
        wherein the second gate impedance is coupled to the second gate terminal, and
        wherein the second gate impedance is lower in resistance than the first gate impedance.

* * * * *